(12) United States Patent
Tsutsumi et al.

(10) Patent No.: US 7,768,456 B2
(45) Date of Patent: Aug. 3, 2010

(54) ANTENNA DEVICE AND RADIO COMMUNICATION DEVICE

(75) Inventors: Yukako Tsutsumi, Yokohama (JP); Mitsuyoshi Endo, Yamato (JP); Mitsuhiro Nakao, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 377 days.

(21) Appl. No.: 12/004,480

(22) Filed: Dec. 21, 2007

(65) Prior Publication Data
US 2008/0231518 A1  Sep. 25, 2008

(30) Foreign Application Priority Data
Dec. 27, 2006  (JP) .............. 2006-352858

(51) Int. Cl.
*H01Q 1/38* (2006.01)
(52) U.S. Cl. .............................. 343/700 MS
(58) Field of Classification Search .......... 343/700 MS, 343/795, 803–804, 742; 340/572, 793
See application file for complete search history.

(56) References Cited

U.S. PATENT DOCUMENTS

| | | | |
|---|---|---|---|
| 5,682,143 A | 10/1997 | Brady et al. | |
| 6,078,259 A * | 6/2000 | Brady et al. | ............ 340/572.7 |
| 6,271,793 B1 * | 8/2001 | Brady et al. | .......... 343/700 MS |
| 6,662,430 B2 * | 12/2003 | Brady et al. | .................. 29/600 |
| 7,295,161 B2 * | 11/2007 | Gaucher et al. | ....... 343/700 MS |
| 7,559,131 B2 * | 7/2009 | Credelle et al. | ............... 29/600 |
| 7,619,529 B2 * | 11/2009 | Goff et al. | ................ 340/572.4 |

FOREIGN PATENT DOCUMENTS

| | | |
|---|---|---|
| JP | 8-88581 | 4/1996 |
| JP | 8-213419 | 8/1996 |
| JP | 2005-228226 | 8/2005 |
| WO | 96/13793 | 5/1996 |

* cited by examiner

*Primary Examiner*—Huedung Mancuso
(74) *Attorney, Agent, or Firm*—Nixon & Vanderhye, PC (57) ABSTRACT

First and second wires are formed so that the further away from a semiconductor chip, the greater the distance between the first and second wires. This prevents currents flowing through the first and second wires from cancelling out each other, and further enables a metallic plate to be disposed as far away from the semiconductor chip as possible. In addition, configuring the metallic plate to have a constant width that is wider than the diameters of the first and second wires results in a wide connection range, thereby ensuring connection even when mounting misalignments occur between the wires and the metallic plate.

16 Claims, 11 Drawing Sheets

○ MIDPOINT OF CURRENT PATHWAY
| MIDLINE OF METAL PORTION

ANTENNA DEVICE AND RADIO COMMUNICATION DEVICE

CROSS REFERENCE TO RELATED APPLICATIONS

This application is based upon and claims the benefit of priority from the prior Japanese Patent Applications No. 2006-352858, filed on Dec. 27, 2006; the entire contents of which are incorporated herein by reference.

BACKGROUND OF THE INVENTION

1. Field of the Invention

The present invention relates to an antenna device and a radio communication device.

2. Related Art

A size of an antenna depends on operating frequency. For example, with high-frequency wavebands such as the millimeter waveband, the short wavelength of the operating frequency enables downsizing of an antenna and incorporation thereof into a semiconductor package. In order to mount an antenna into a semiconductor package, the antenna must be mounted in proximity to a semiconductor chip. As an example of mounting an antenna onto a substrate, a radio frequency tag device is known in which wires operating as an antenna are bonded to a semiconductor chip (for example, refer to FIG. 4 of JP-A 8-88581 (Kokai)).

This radio frequency tag device includes a semiconductor chip fixed on a substrate and one or more wires that operate as an antenna, and is covered by an organic covering. The wires have both ends connected to the semiconductor chip by wire bonding, and operate as an antenna. The lengths of the wires are determined by the frequency of a radio frequency signal.

According to the conventional radio frequency tag device described above, since the wires that operate as an antenna are directly connected to a semiconductor chip, a short feeder between the antenna and a circuit element will suffice, resulting in an advantage in that feeding loss can be reduced. However, with the conventional radio frequency tag device, since the vicinity of a feeding point where current intensity is high and which is a main radiating source is in proximity to the semiconductor chip, there is a problem in that electromagnetic waves are absorbed by the semiconductor chip, causing significant deterioration in efficiency and gain.

In addition, this radio frequency tag device assumes frequencies up to the microwave band. In the case where the wavelength is somewhat long such as in conventional radio communication using the microwave band, production errors including a certain degree of misalignment in wire bonding positions can be ignored. However, in the case of high frequencies (millimeter waveband or higher) where the wavelength is short, there is a problem in that production errors such as misalignments in wire bonding positions become too large to ignore, thereby affecting antenna characteristics.

SUMMARY OF THE INVENTION

According to an aspect of the present invention, there is provided with an antenna device comprising:
a dielectric substrate;
a semiconductor chip disposed on the dielectric;
a metallic plate having a band-like shape with a constant width and having a constant width that is wider than diameters of the first and second wires, formed on the dielectric substrate so as to be approximately parallel to at least one side of the semiconductor chip;
first and second feeders formed on the semiconductor chip;
a first wire having first and second ends, the first end being connected with the first feeder and the second end being connected with the metallic plate; and
a second wire having third and fourth ends, the third end being connected with the second feeder and the fourth end being connected the metallic plate, wherein
a distance L1 between the first end of the first wire and the third end of the second wire is smaller than a distance L2 between the second end of the first wire and the fourth end of the second wire (L1<L2).

According to an aspect of the present invention, there is provided with an antenna device comprising:
a dielectric substrate;
a semiconductor chip disposed on the dielectric substrate;
first and second metallic plates formed on the dielectric substrate;
first and second feeders formed on the semiconductor chip; and
a first wire configured to connect the first metallic plate and the first feeder, and a second wire configured to connect the second metallic plate and the second feeder, wherein
a distance L1 between connections of the first and second wires and the first and second feeders and a distance L2 between connections of the first and second wires and the first and second metallic plates has a relationship of L1<L2, and
the first and second metallic plates include:
first and second metal parts respectively formed so as to include respective connections with the first and second wires, and which are also respectively formed so that areas thereof are wider than cross-sectional areas of the first and second wires, and
a third metal part, having a width that is narrower than the first and second metal parts, and formed so as to extend from the first and second metal parts in approximately a vertical direction with respect to the semiconductor chip and which are also formed so as to electrically connect the first and second metal parts each other.

BRIEF DESCRIPTION OF THE DRAWINGS

FIG. 10 is a diagram showing a radiation direction when FIG. 2 is viewed from the side;

FIG. 11 is a diagram showing a radiation direction when FIG. 8 is viewed from the side;

DETAILED DESCRIPTION OF THE INVENTION

Embodiments will now be described in detail with reference to the drawings.

(1) First Embodiment

Figure 1:
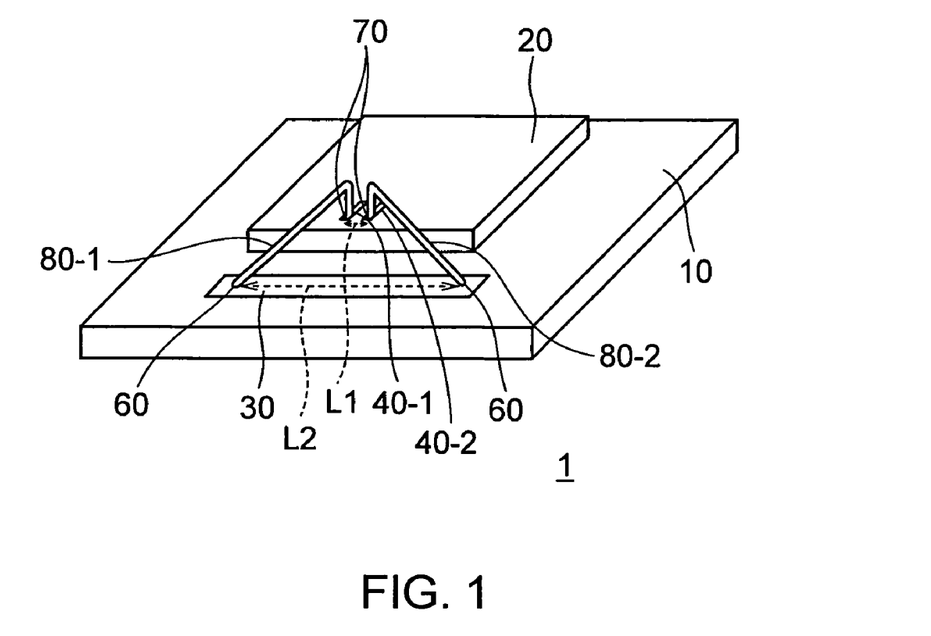
FIG. 1 is a diagram showing a general configuration of an antenna device according to a first embodiment of the present invention.

FIG. 1 is a diagram showing a general configuration of an antenna device 1 according to a first embodiment of the present invention. The antenna device 1 shown in FIG. 1 is constituted by a dielectric substrate 10, a semiconductor chip 20 disposed on the dielectric substrate 10, a metallic plate 30 provided on the dielectric substrate 10, differential feeders 40 (a first feeder 40-1 and a second feeder 40-2) on the semiconductor chip 20; and wires 80 (a first wire 80-1 and a second wire 80-2) respectively connecting two locations on the metallic plate 30 with each of the differential feeders 40.

The dielectric substrate 10 is made of, for example, epoxy resin, glass, ceramic, or the like. The semiconductor chip 20 on which, an insulation layer is formed, is made of, for example, silicon, silicon germanium, gallium arsenide or the like, and a circuit pattern is formed using bronze, aluminum, gold or the like on top of the insulation layer.

The metallic plate 30 on the dielectric substrate 10 is made of, for example, copper, aluminum, gold or the like, and is disposed so as to be approximately parallel to one side of the semiconductor chip 20. The metallic plate 30 has a band-like shape having a constant width that is sufficiently wider than the diameter of the wires 80.

The differential feeders 40 include the first feeder 40-1 and the second feeder 40-2. The differential feeders 40 are disposed in the vicinity of one side of the semiconductor chip 20 that is approximately parallel to the metallic plate 30, and the first feeder 40-1 and the second feeder 40-2 respectively transmit signals whose phases are opposite to each other.

The wires 80 include the first wire 80-1 and the second wire 80-2 that are made of copper, aluminum, gold, or the like. One end of the first wire 80-1 is connected to the first feeder 40-1, and the other end is connected to the vicinity of one end of the metallic plate 30. In a similar manner, one end of the second wire 80-2 is connected to the second feeder 40-2, and the other end is connected to the vicinity of the other end of the metallic plate 30. A loop formed by the metallic plate 30 and the wires 80 has a triangular shape, and is set so that one circumference thereof is approximately equivalent to one wavelength of the used radio frequency. In other words, when it is assumed that the distance between the respective connections of the wires 80 and the differential feeders 40 is L1 and the distance between the respective connections of the wires 80 and the metallic plate 30 is L2, the distance L1 is shorter than the distance L2 (L1<L2).

Figure 2:
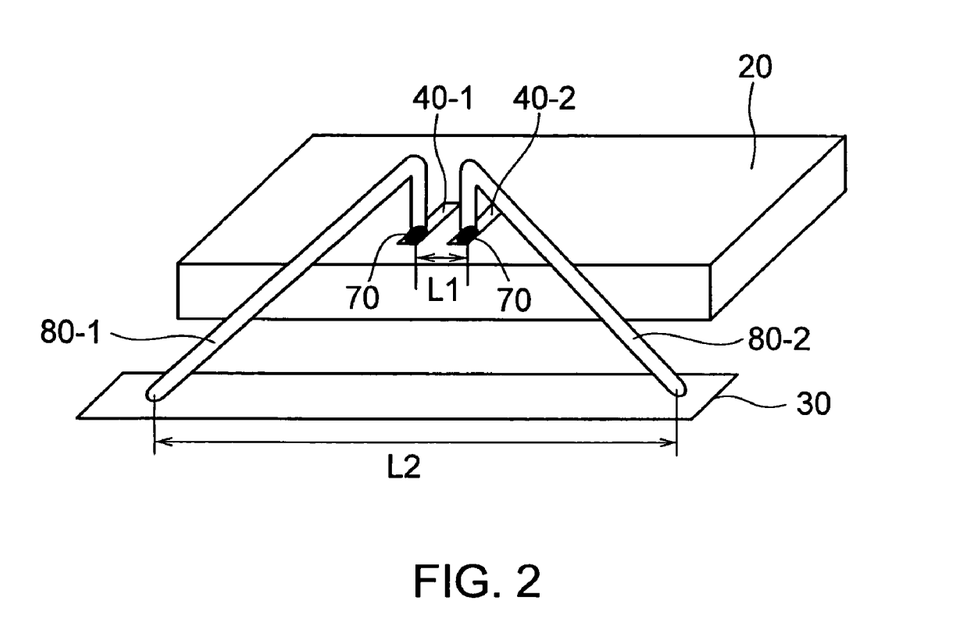
FIG. 2 is an enlarged view of a portion of the antenna device.

A description thereof will be given with reference to FIG. 2. FIG. 2 is an enlarged view of a portion of the antenna device shown in FIG. 1. As shown in FIG. 2, one end of the first wire 80-1 is connected to the first feeder 40-1, and the other end is connected to the vicinity of one end of the metallic plate 30. In a similar manner, one end of the second wire 80-2 is connected to the second feeder 40-2, and the other end is connected to the vicinity of the other end of the metallic plate 30. In addition, the distance between a connection 70 of the wire 80-1 and the differential feeder 40-1 and a connection 70 of the wire 80-2 and the differential feeder 40-2 is assumed to be L1. The distance between a connection of the wire 80-1 and the metallic plate 30 and a connection of the wire 80-2 and the metallic plate 30 is assumed to be L2. In this case, the distance L1 is shorter than the distance L2 (L1<L2).

In a closed loop formed by the metallic plate 30 and the wires 80 through which current flows, current intensity is high at two locations, namely, the vicinity of the differential feeders 40 and the vicinity of the center of the metallic plate 30. Since the two locations are separated by a distance equivalent to approximately half wavelength, the direction of the currents is the same. Therefore, with the antenna device 1 shown in FIG. 1, radiation is performed primarily by high-intensity currents at two locations which flow in the same direction.

Figure 10:
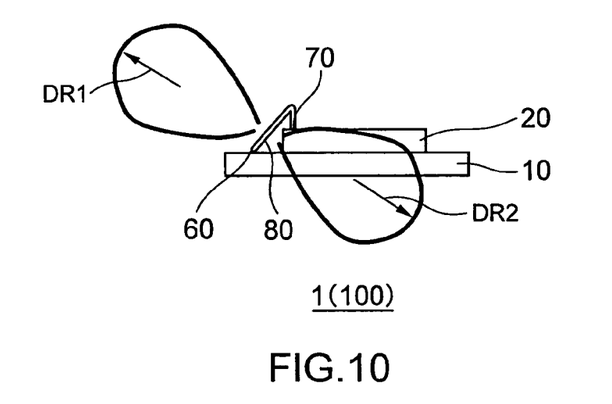

FIG. 10 is a diagram showing a radiation direction when FIG. 1 is viewed from the side. In FIG. 1, since a line connecting the vicinity of the differential feeders 40 and the vicinity of the center of the metallic plate 30 that are the two locations having the greatest current is oblique with respect to the semiconductor chip 20, a composite current of the currents at the two locations primarily performs radiation. Accordingly, the antenna device 1 shown in FIG. 1 has an inclined radiation pattern as shown in FIG. 10.

Generally, the semiconductor chip 20 has a lower resistivity compared to an insulator such as the dielectric substrate 10 or the like, and acts somewhat like an absorber. Therefore, the further away the portions through which a large current flows are from the semiconductor chip 20, the better. For example, radiating elements (corresponding to the wires 80 and the metallic plate 30 in the present embodiment) should be disposed to be distanced from the semiconductor chip 20. However, disposing the radiating elements to be distanced from the semiconductor chip 20 lengthens the differential feeders 40 connecting the semiconductor chip 20 and the radiating elements. Since the differential feeders 40 are a pair of two feeder pathways that transmit opposite-phase signals, the currents cancel out each other and hardly any electromagnetic waves are radiated. Lengthening the differential feeders 40 that hardly radiate electromagnetic waves for the purpose of distancing the radiating elements from the semiconductor chip 20 results in a corresponding amount of transmission loss.

With the antenna device 1 according to the present embodiment, the two wires 80-1 and 80-2 are extended from the two connections 70 of the differential feeders 40 and the wires 80 on the semiconductor chip 20 so as to distance themselves from the semiconductor chip 20, and the two wires 80 are extended so as to spread out with respect to each other. Since the phases of the currents flowing through the wires 80-1 and 80-2 are opposite to each other, disposing the wires in proximity and parallel to each other causes the wires to mutually cancel out their currents. A conceivable method for suppressing the cancelling out of currents is to extend the wires 80-1 and 80-2 in directions mutually separating from the connections 70. However, this will bring the metallic plate 30 that contributes to radiation in proximity to the semiconductor chip 20 and therefore increases absorption loss. On the other hand, as with the antenna device 1 according to the present embodiment, by extending the two wires 80-1 and 80-2 so as to spread out with respect to each other and connecting the same to the metallic plate 30, the two wires 80-1 and 80-2 can be distanced from each other and portions having high current intensity may be distanced from the semiconductor chip 20. Consequently, both absorption loss due to being in proximity to the semiconductor chip 20 and transmission loss due to extending the wires 80 in parallel can be suppressed, and higher efficiency and gain may be achieved.

Furthermore, the wide band-like shape of the metallic plate 30 offers a wide connection range and connection can be made securely even if a mounting misalignment of the semiconductor chip 20 occurs.

Moreover, as shown in FIG. 4(*a*), in the case of the metallic plate 90 of the comparative example where the current pathway at the metallic plate 30 (90), such as the central portion electrically connecting the two connections 60, is formed as a linear shape that is narrower than the width of both end portions (FIG. 4(*a*)), portions where current disperses (the shaded area in FIG. 4(*a*)) become left-right asymmetrical due to the misalignment of the wires 80 and the connections 60, thereby disrupting current balance and causing variations in antenna characteristics.

In comparison, as is the case with the present embodiment, by arranging the entire metallic plate 30 to have a band-like shape with a constant width sufficiently wider than the diameter of the wires 80 (FIG. 4(*b*)), current balance is always left-right symmetrical even when a misalignment of the connections 60 of the wires 80 and the metallic plate 30 occurs. Consequently, changes in current flow are small and variations in antenna characteristics can be reduced.

(2) Second Embodiment

Figure 3:
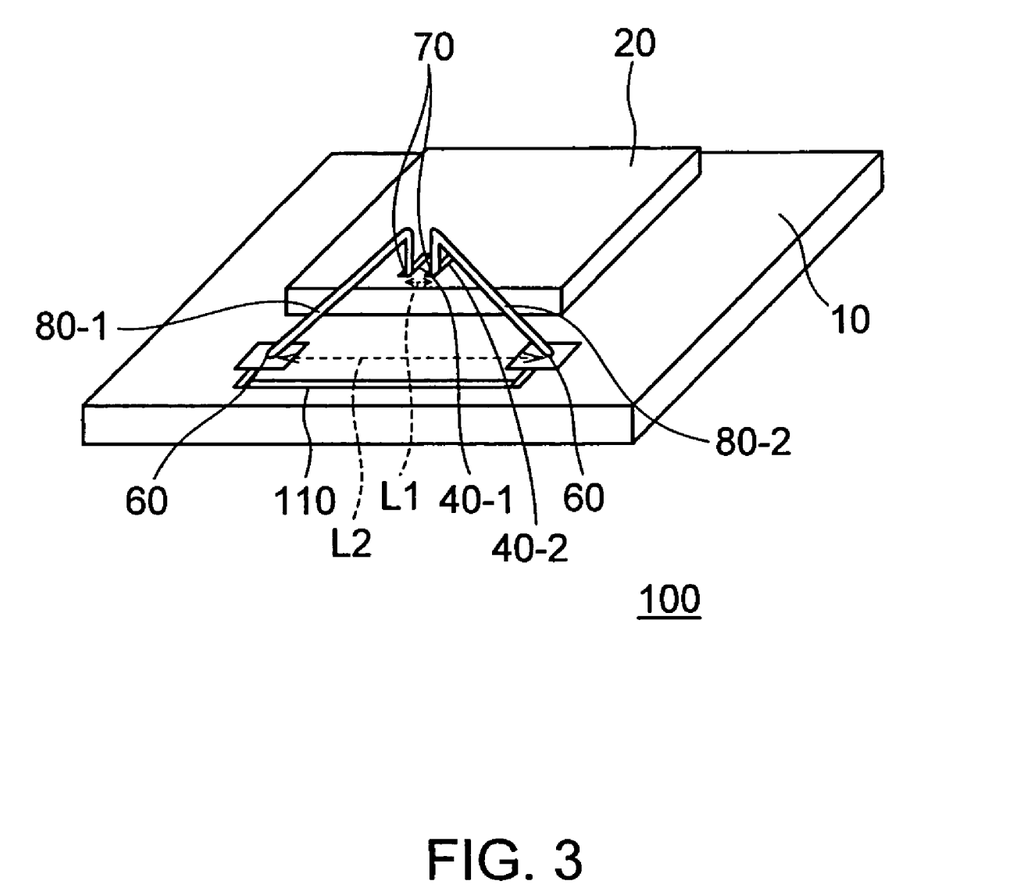
FIG. 3 is a diagram showing a general configuration of an antenna device according to a second embodiment of the present invention.
Figure 4A:
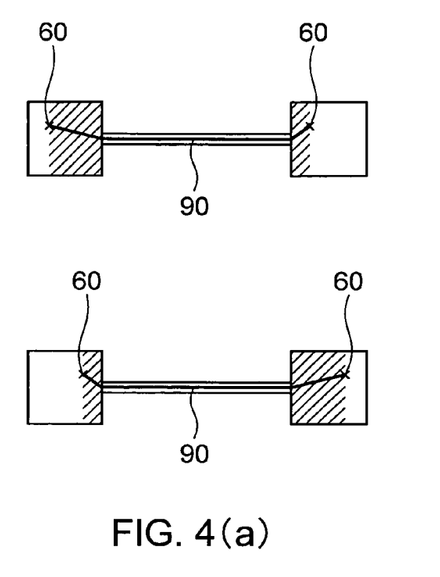
FIG. 4 is a diagram showing a current pathway in a metallic plate.
Figure 4B:
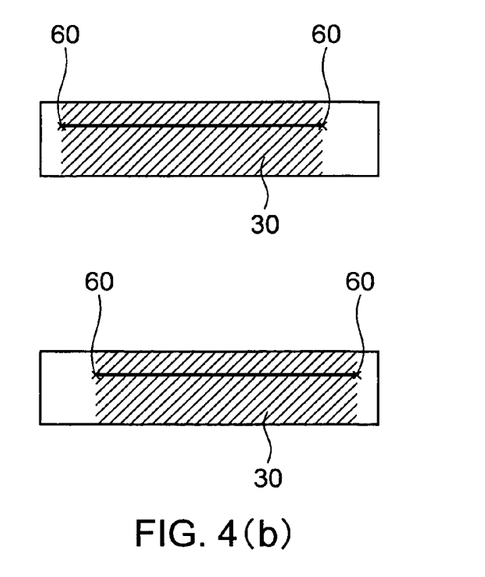
Figure 4C:
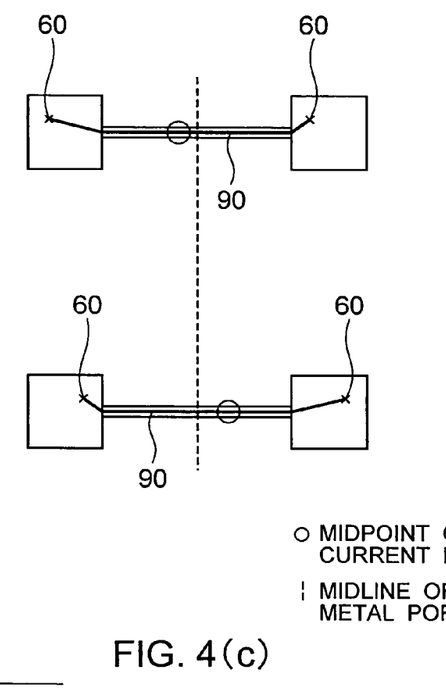
Figure 4D:
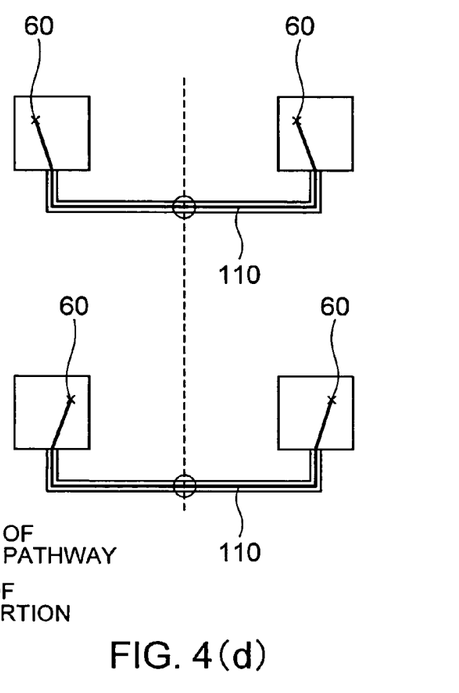

FIG. 3 is a diagram showing a general configuration of an antenna device 100 according to a second embodiment of the present invention. With the exception of the shape of a metallic plate 110, the configuration and operations of the antenna device 100 according to the present embodiment are the same as those of the antenna device 1 shown in FIG. 1. Therefore, like reference numerals will be assigned and a description thereof will be omitted.

The metallic plate 110 is made of, for example, copper, aluminum, gold or the like, and is disposed on the dielectric substrate 10 so as to be approximately parallel to one side of the semiconductor chip 20. The area of the metallic plate 110 is large in the periphery of the connections 60 with the wires 80, and connection is made after a pathway electrically connecting the two connections 60 is extended in a vertical direction with respect to the semiconductor chip 20.

The increased area of the metallic plate 110 in the periphery of the two connections 60 provides a wide connection area, thereby ensuring secure connection even when a mounting misalignment occurs.

In addition, as indicated by the metallic plate 90 shown in FIG. 4(*c*), in the case where, for example, the portion electrically connecting the two connections 60 is formed so as to pass through a straight shortest path (FIG. 4(*c*)), misalignments of the wires 80 and the connections 60 alters the current pathway and causes a displacement of high current intensity portions.

In comparison, as is the case with the present embodiment, by performing connection after extending in a vertical direction with respect to the semiconductor chip 20 (FIG. 4(*d*)), changes in high current intensity portions do not occur even when a misalignment of the connections 60 with the wires 80 occurs, and variations in antenna characteristics can be reduced.

(First Variation)

Figure 5:
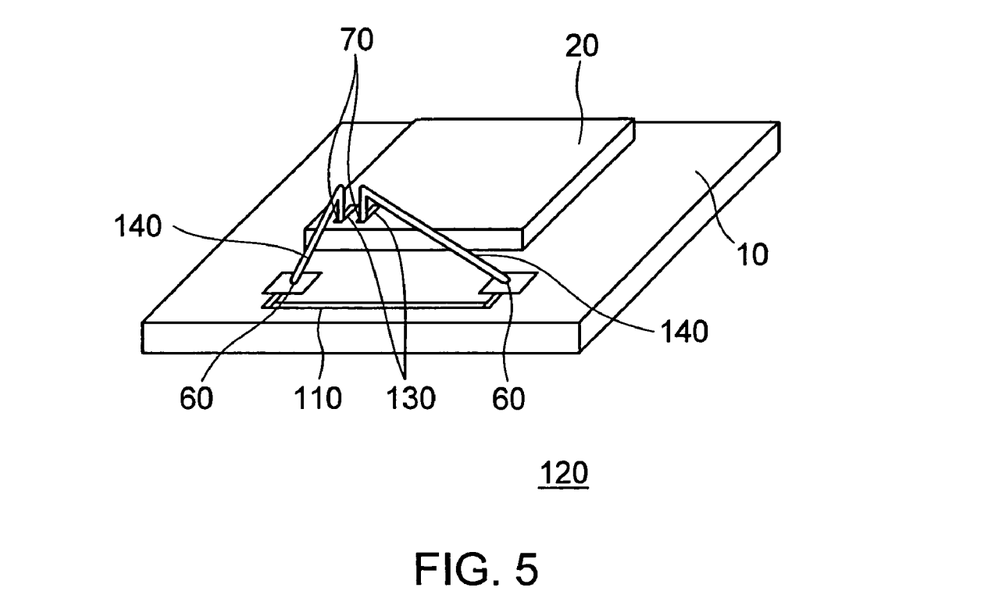
FIG. 5 is a diagram showing a variation of FIG. 2 in which two wires are arranged so as to be asymmetrical.

FIG. 5 shows an antenna device 120 according to a first variation of the present embodiment. In the antenna device 120 shown in FIG. 5, two wires 140 are arranged so as to be asymmetrical or, in other words, arranged so that the lengths of the left and right wires 140 are different.

By arranging the two wires 140 to have different lengths and to be asymmetrical, the circumference of a loop formed by the metallic plate 110 and the wires 140 may be set to be approximately equal to one wavelength of the used radio frequency even when the positions of differential feeders 130 or the position of the metallic plate 110 on the semiconductor chip 20 change varyingly, resulting in an increase of the degree of freedom in design and saving of space.

The same effect may be achieved by arranging the two wires 80 shown in FIG. 1 to be asymmetrical.

(Second Variation)

Figure 6:
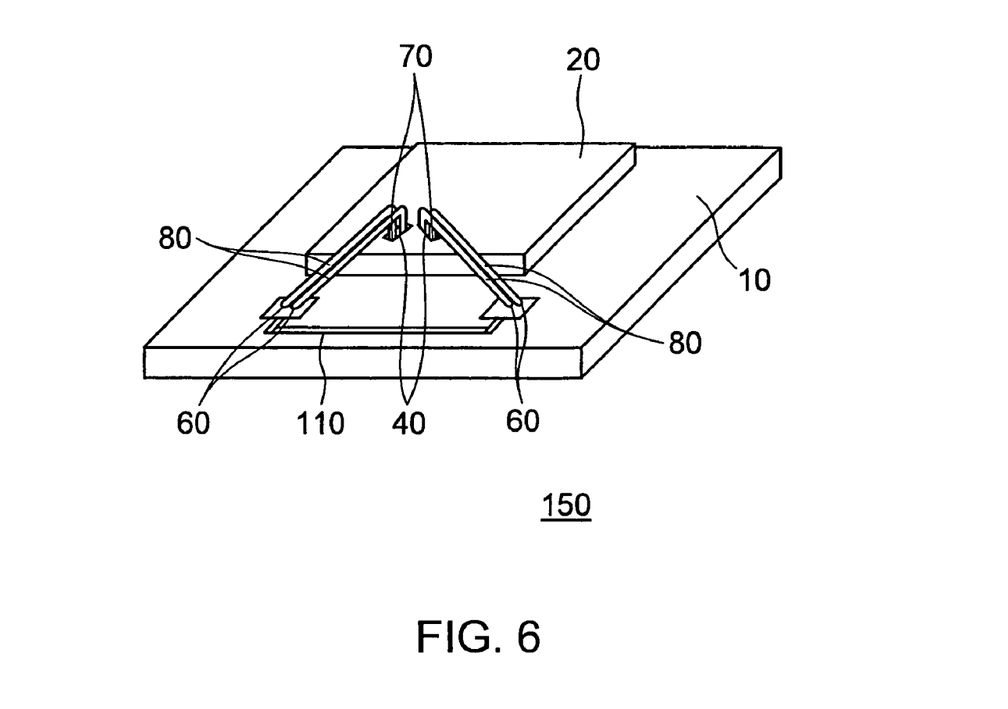
FIG. 6 is a diagram showing a variation of FIG. 2 in which the numbers of wires and connections have been doubled.

FIG. 6 shows an antenna device 150 according to a second variation of the present embodiment. The antenna device shown in FIG. 6 is obtained by doubling the number of wires 80 and the connections 60 of the antenna device shown in FIG. 3. Ends of the two wires 80 are respectively connected to each of the differential feeders 40 that are a pair of feeders. The other ends of the two wires 80 are respectively connected to portions close to both ends of the metallic plate 110 and which have areas wider than the center of the metallic plate 110.

By pluralizing the number of wires 80, the amount of current flowing through the connections 70 of the differential feeders 40 and the wires 80 or through the wires 80 increases. Consequently, the input impedance of the antenna device 150 from the perspective of the vicinity of the connections 70 of the differential feeders 40 and the wires 80 decreases, thereby enabling adjustment of impedance matching.

Note that the same effect may be achieved by doubling the numbers of wires 80 and the connections 60 shown in FIG. 1.

(Third Variation)

Figure 7:
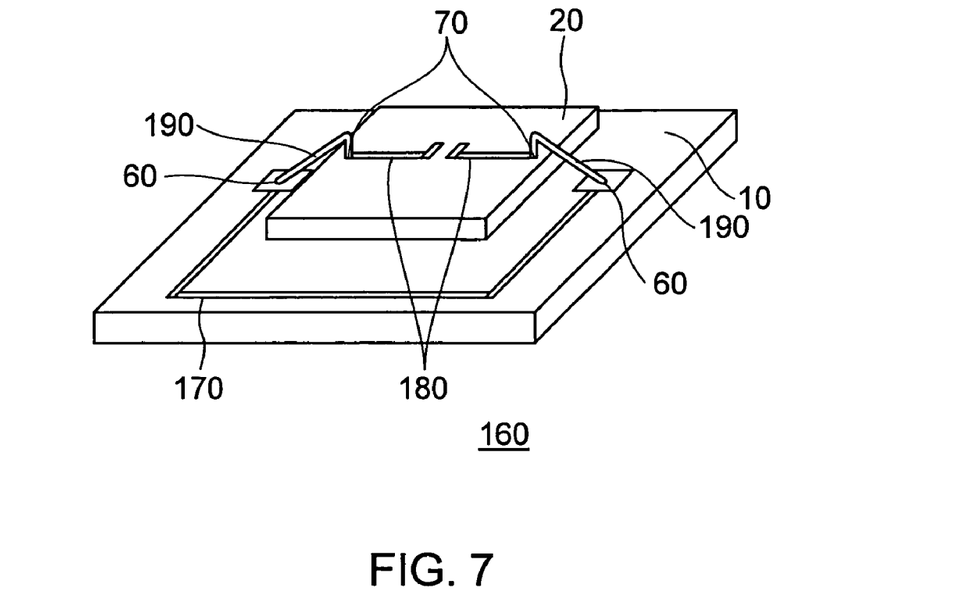
FIG. 7 is a diagram showing a variation of FIG. 2 in which a metallic plate is disposed so as to follow the plurality of sides of a semiconductor chip.

FIG. 7 shows an antenna device 160 according to a third variation of the present embodiment. With the antenna device 160 shown in FIG. 7, a metallic plate 170 is disposed along three sides of the rectangular semiconductor chip 20.

By disposing the metallic plate 170 along a plurality of sides of the semiconductor chip 20, antenna length can be extended even when the semiconductor chip 20 is small, and the circumference of the loop formed by the metallic plate 170 and wires 190 may be arranged so as to approximately equal one wavelength of the used radio frequency.

The same effects may be achieved by disposing the metallic plate 30 shown in FIG. 1 along a plurality of sides of the semiconductor chip 20.

(3) Third Embodiment

Figure 8:
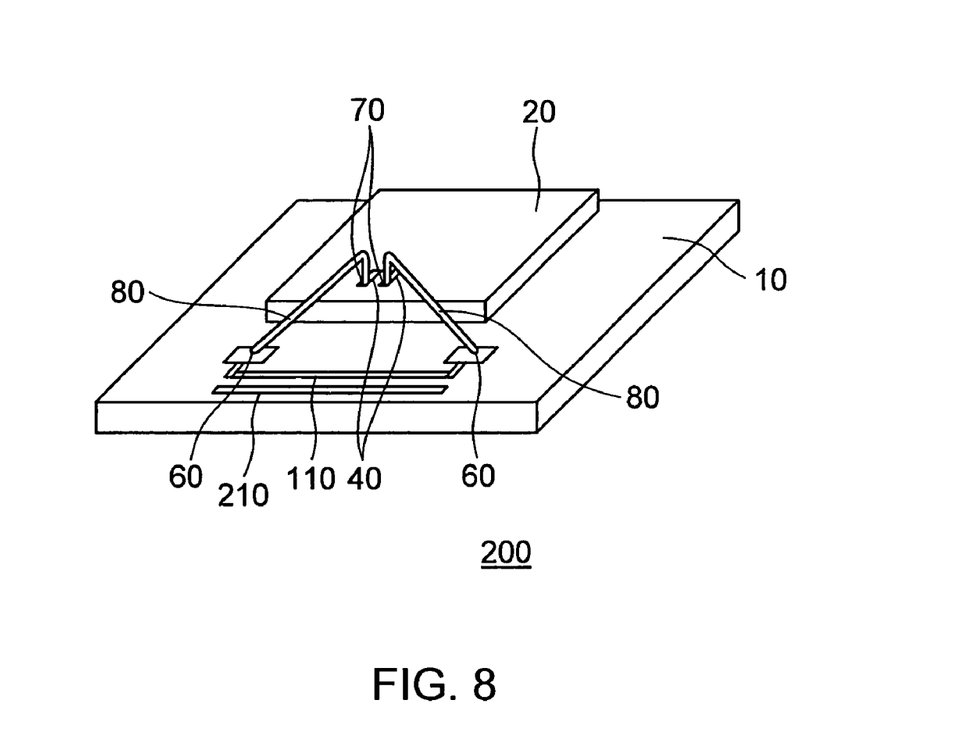
FIG. 8 is a diagram showing a general configuration of an antenna device according to a third embodiment of the present invention.

FIG. 8 is a diagram showing a general configuration of an antenna device 200 according to a third embodiment of the present invention. With the exception of a parasitic metal element 210 disposed on the dielectric substrate 10, the configuration of the antenna device 200 shown in FIG. 8 is the same as that of the antenna device 100 shown in FIG. 3. Therefore, like reference numerals will be assigned and a description thereof will be omitted.

The parasitic metal element 210 is made of, for example, copper, aluminum, gold or the like, and is arranged to have a length approximately equal to half wavelength of the used radio frequency. The parasitic metal element 210 is disposed on the opposite side of the semiconductor chip 20 with respect to the metallic plate 110 so as to be approximately parallel to the metallic plate 110.

Disposing the parasitic metal element 210 on the opposite side of the semiconductor chip 20 with respect to the metallic plate 110 so as to be adjacent to the metallic plate 110 in this manner causes current to flow through the parasitic metal element 210 due to coupling with the metallic plate 110. When current flows, electromagnetic waves are also radiated from the parasitic metal element 210, and as a result, radiation towards the side of the parasitic metal element 210 intensifies and gain increases. Therefore, directing gain towards the semiconductor chip having low resistivity and high loss reduces loss due to the absorption of electromagnetic waves, and deterioration of radiation efficiency and gain can be further prevented than the antenna device 100 shown in FIG. 3.

While a case has been described in which the parasitic metal element 210 is disposed in the antenna device 100 shown in FIG. 3, similar effects may be achieved by disposing the parasitic metal element 210 in the antenna device 1 shown in FIG. 1 in the same manner.

(4) Fourth Embodiment

Figure 9:
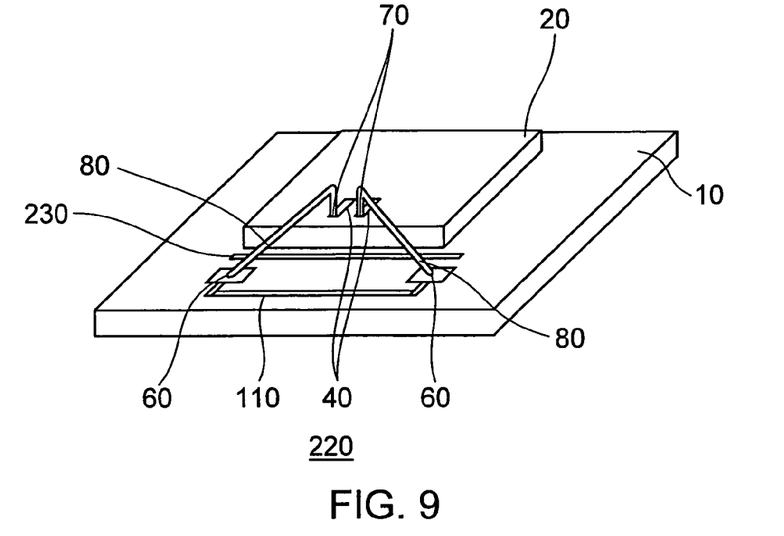
FIG. 9 is a diagram showing a general configuration of an antenna device according to a fourth embodiment of the present invention.

FIG. 9 is a diagram showing a general configuration of an antenna device 220 according to a fourth embodiment of the present invention. With the exception of a parasitic metal element 230 disposed on the dielectric substrate 10, the configuration of the antenna device 220 shown in FIG. 9 is the same as that of the antenna device 100 shown in FIG. 3. Therefore, like reference numerals will be assigned and a description thereof will be omitted.

The parasitic metal element 230 is made of, for example, copper, aluminum, gold or the like, and is arranged to have a length approximately equal to half wavelength of the used radio frequency. The parasitic metal element 230 is disposed between the metallic plate 110 and the semiconductor chip 20 so as to be approximately parallel to the metallic plate 110.

Operations of the antenna device 220 according to the present embodiment will now be described with reference to FIG. 11.

Figure 11:
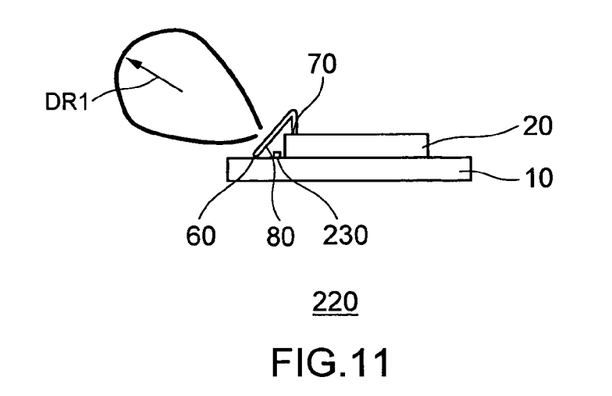

FIG. 11 is a diagram showing a radiation direction when the antenna device 230 shown in FIG. 9 is viewed from the side. As described above, FIG. 10 is a diagram showing a radiation direction when the antenna device 100 shown in FIG. 3 is viewed from the side. With the antenna device 100 shown in FIG. 3, the portions where current is largest are the two portions, namely, the vicinity of the differential feeders 40 and the vicinity of the center of the metallic plate 110. Since a straight line connecting the two portions is oblique with respect to the semiconductor chip 20, a composite current of the currents at the two locations primarily performs radiation. Accordingly, the antenna device 100 shown in FIG. 3 has an inclined radiation pattern as shown in FIG. 10.

While nothing in the direction DR1 shown in FIG. 10 blocks radiation, in the direction DR2, the semiconductor chip, a grounding conductor of the circuit or the like causes radiation to be absorbed and reflected. This results in a loss, and in turn, deterioration of radiation efficiency and gain.

On the other hand, by disposing the parasitic metal element 230 between the metallic plate 110 and the semiconductor chip 20 as shown in FIG. 9, a coupling with the metallic plate 110 causes current to flow through the parasitic metal element 230. Due to the phase difference between the composite current of the two locations, namely, the vicinity of the differential feeders 40 and the vicinity of the center of the metallic plate 110, and the current of the parasitic metal element 230, with the direction DR2 shown in FIG. 10, the phase difference between an electromagnetic wave radiated by the composite current of the two locations, namely, the vicinity of the differential feeders 40 and the vicinity of the center of the metallic plate 110 and an electromagnetic wave radiated from the parasitic metal element 230 approaches 180 degrees or, in other words, reverse phases to each other. As a result, radiation is completely cancelled out as shown in FIG. 11. However, in the direction DR1, the phase difference does not become reverse phases and radiation occurs. Therefore, radiation in the direction resulting in loss is suppressed, and electromagnetic waves are radiated in the direction DR1 as shown in FIG. 11.

As seen, according to the present embodiment, by disposing the parasitic metal element 230 between the metallic plate 30 and the semiconductor chip 20, the direction of radiation of electromagnetic waves may be inclined towards the direction DR1 in which the semiconductor chip 20 does not exist. As a result, radiation in the direction DR2 in which radiation is not desirable may be suppressed, while gain in the direction DR1 in which radiation is desirable may be increased, and loss due to the semiconductor chip or the grounding conductor can be reduced.

Note that similar effects may be achieved by disposing the parasitic metal element 230 between the metallic plate 30 and the semiconductor chip 20 on the dielectric substrate 10 of the antenna device 1 shown in FIG. 1.

(5) Fifth Embodiment

Figure 12:
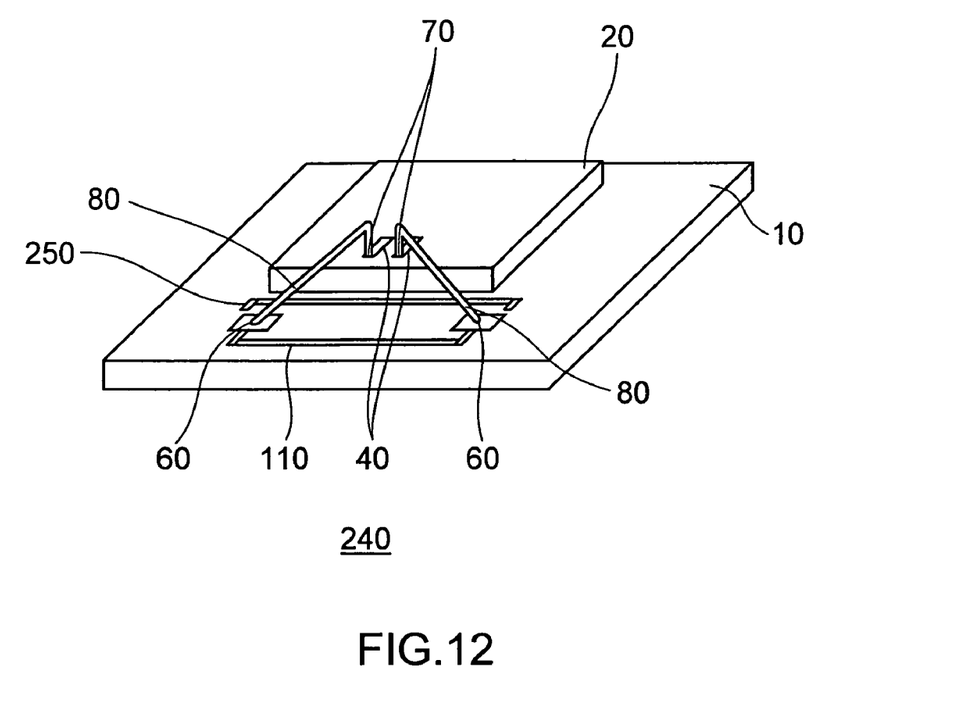
FIG. 12 is a diagram showing a general configuration of an antenna device according to a fifth embodiment of the present invention.

FIG. 12 is a diagram showing a general configuration of an antenna device 240 according to a fifth embodiment of the present invention. With the exception of an open end of a parasitic metal element 250 bended in the direction of the metallic plate 110, the configuration and operation of the antenna device 240 according to the fifth embodiment is the same as the antenna device 220 shown in FIG. 9. Therefore, like reference numerals will be assigned and a description thereof will be omitted.

Bending the open end of the parasitic metal element 250 in the direction of the metallic plate 110 strengthens the coupling between the metallic plate 110 being fed and the parasitic metal element 250. As a result, the current of the parasitic metal element 250 increases, thereby effectively suppressing radiation in a combined direction (the direction DR2 in FIG. 10) of the direction of the semiconductor chip 20 and the direction of the back side of the dielectric substrate 10 on which a grounding conductor (upon implementation, a grounding conductor or a solder ball will be disposed on the back side of the dielectric substrate) or the like exists.

Figure 13:
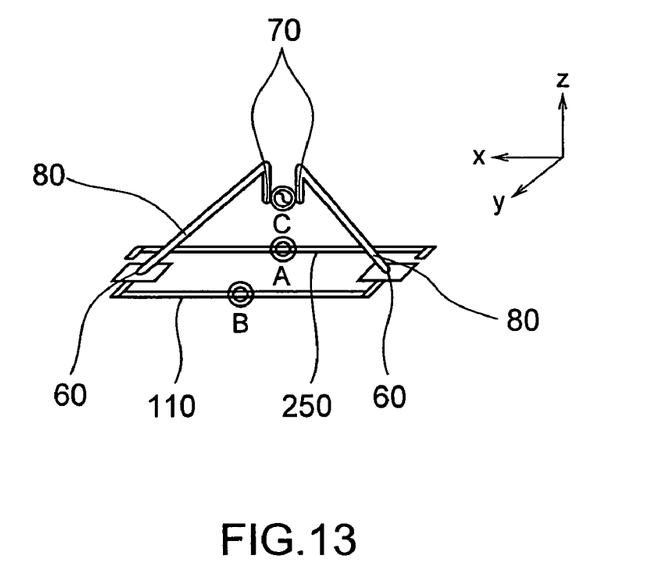
FIG. 13 is a diagram showing a case in which the dielectric substrate and the semiconductor chips have been removed from FIG. 11.

FIG. 13 is an enlarged view of a portion (hereinafter referred to as a radiating element of the antenna device 240) excluding the dielectric substrate 10 and the semiconductor chip 20 shown in FIG. 12. Point A denotes the midpoint of the parasitic metal element 250; point B denotes the midpoint of the metallic plate 110; and point C denotes the midpoint of the two connections 70 of the differential feeders 40 and the wires

80. These three points are portions having a high current value as compared to other portions.

When it is assumed that the total combined length of the metallic plate 110 and the wires 80 is approximately one wavelength, the length of the parasitic metal element 250 is approximately half wavelength and the distance between point A and point B is approximately one-eighth wavelength, the result of a simulation on current values at points A, B and C was as follows: amplitude 2.6 [A] and phase 109 [degrees] at point A; amplitude 1.3 [A] and phase −43 [degrees] at point B; and amplitude 1.6 [A] and phase −51 [degrees] at point C. The amplitude of the current at point A is close to the combined amplitude value of points B and C, and the phases of points B and C are close values. In addition, point A has a phase lead of about 150° over points B and C.

Figure 14:
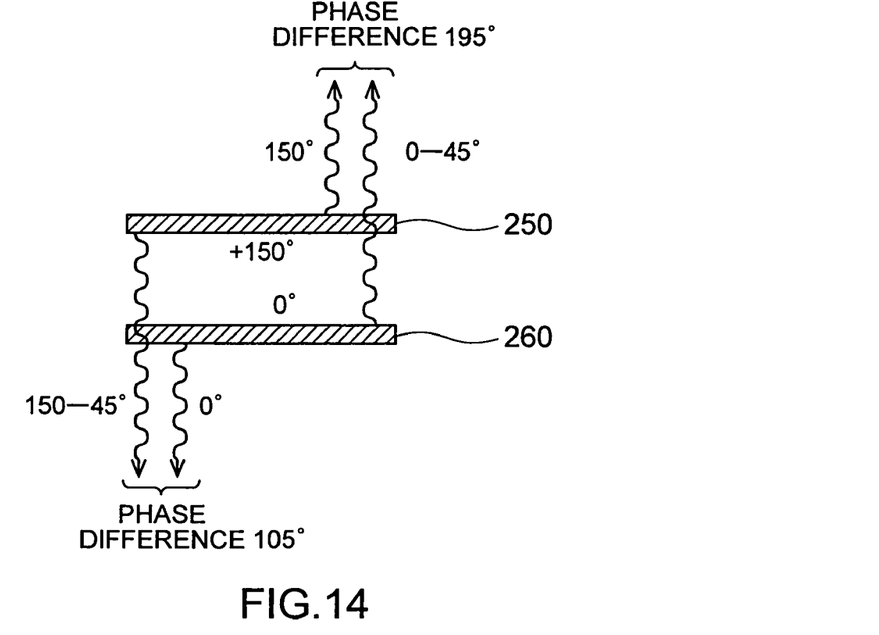
FIG. 14 is a diagram depicting radiation according to FIG. 12.

FIG. 14 is a schematic view of the radiating element of the antenna device 240 shown in FIG. 13. In FIG. 14, a combination of the vicinity of the differential feeders 40 and the metallic plate 110 whose current values are relatively large is depicted as a combined portion 260, and a bent portion of the parasitic metal element 250 is omitted. The above-described points A and C are on the combined portion 260; the point B is on the parasitic metal element 250.

Since point A has a phase lead of about 150° over points B and C, if the phase of an electromagnetic wave radiated from the combined portion 260 of the metallic plate 110 and the vicinity of the differential feeders 40 at a certain point in time is assumed to be 0°, the phase of an electromagnetic wave radiated from the parasitic metal element 250 is 150°. Observing the side of the parasitic metal element 250 from the combined portion 260 with the position of the parasitic metal element 250 as a reference, since a phase corresponding to approximately ⅛ wavelength that is the distance between point A and point B is 360°/8=45°, the phase of an electromagnetic wave radiated from the combined portion 260 of the metallic plate 110 and the vicinity of the differential feeders 40 and reaching the parasitic metal element 250 can be calculated as 0°−45°=−45°. Therefore, in the direction in which the side of the parasitic metal element 250 is observed from the combined portion 260, the phase difference between the phase of an electromagnetic wave radiated from the combined portion 260 (−45°) and the phase of an electromagnetic wave radiated from the parasitic metal element 250 (150°) can be calculated as 150°−(−45°)=195° or, in other words, almost opposite phase. Consequently, electromagnetic waves are cancelled out in the direction in which the side of the parasitic metal element 250 is observed from the combined portion 260 and hardly any radiation occurs.

Conversely, in the case where the side of the combined portion 260 of the metallic plate 110 and the vicinity of the differential feeders 40 is observed from the parasitic metal element 250, the phase difference between the phase of an electromagnetic wave radiated from the parasitic metal element 250 and reaching the combined portion 260 (150°+(−45°)=105°) and the phase of an electromagnetic wave radiated from the combined portion 260 (0°) can be similarly calculated as 105°−0°=105°. In other words, radiation in the direction in which the side of the combined portion 260 is observed from the parasitic metal element 250 is not suppressed.

Figure 15:
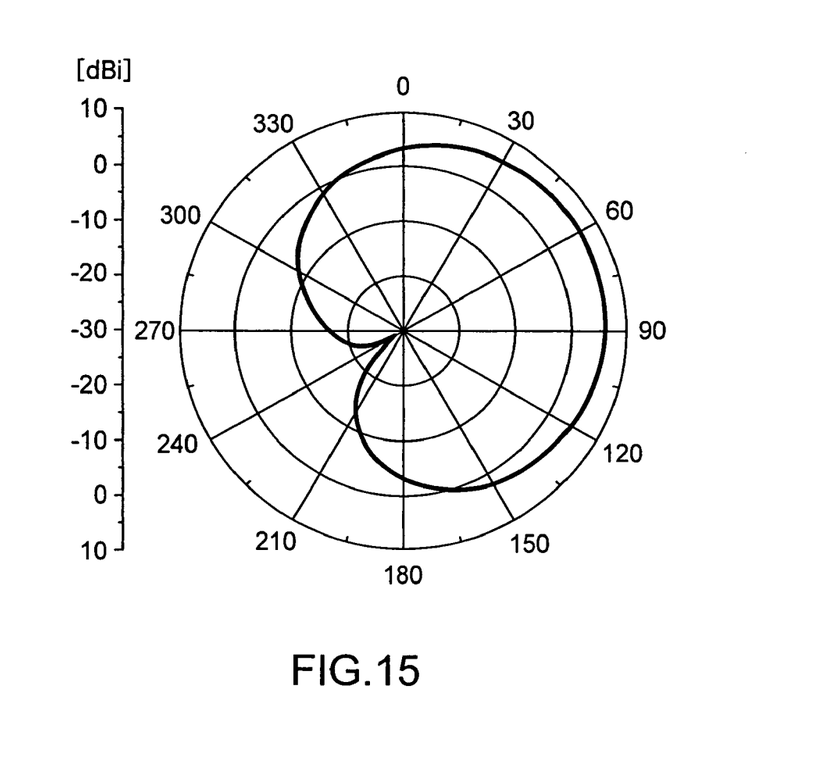
FIG. 15 shows a horizontally polarized wave radiating pattern on a yz plane according to FIG. 12.

FIG. 15 shows a radiation pattern of horizontally polarized waves on a yz plane of a radiating element of the antenna device 240 shown in FIG. 13. Although not shown, radiation of vertically-polarized waves hardly occurs. The gain in the direction in which the side of the parasitic metal element 250 is observed from the combined portion 260 of the metallic plate 110 and the vicinity of the differential feeders 40 or, in other words, the direction DR2 shown in FIG. 10 is −30 dBi, indicating that hardly any radiation occurs. The gain in the direction DR1 shown in FIG. 10 is 6.1 dBi, indicating stronger radiation, and achieves a FB (front to back) ratio of 35 dB or higher. In this manner, radiation in the direction DR2 in which a semiconductor chip, a grounding conductor or the like exists may be significantly suppressed, and deterioration of efficiency and gain can be prevented even when the antenna is installed in the vicinity of a lossy semiconductor chip.

As seen, according to the present embodiment, by bending the open end of the parasitic metal element 250 in the direction of the three-dimensional loop, the coupling between the fed loop and the parasitic metal element 250 is strengthened, increasing current at the parasitic metal element 250 to effectively suppress radiation in the direction in which a semiconductor chip, a grounding conductor or the like exists while promoting radiation in the opposite direction.

(6) Sixth Embodiment

Figure 16:
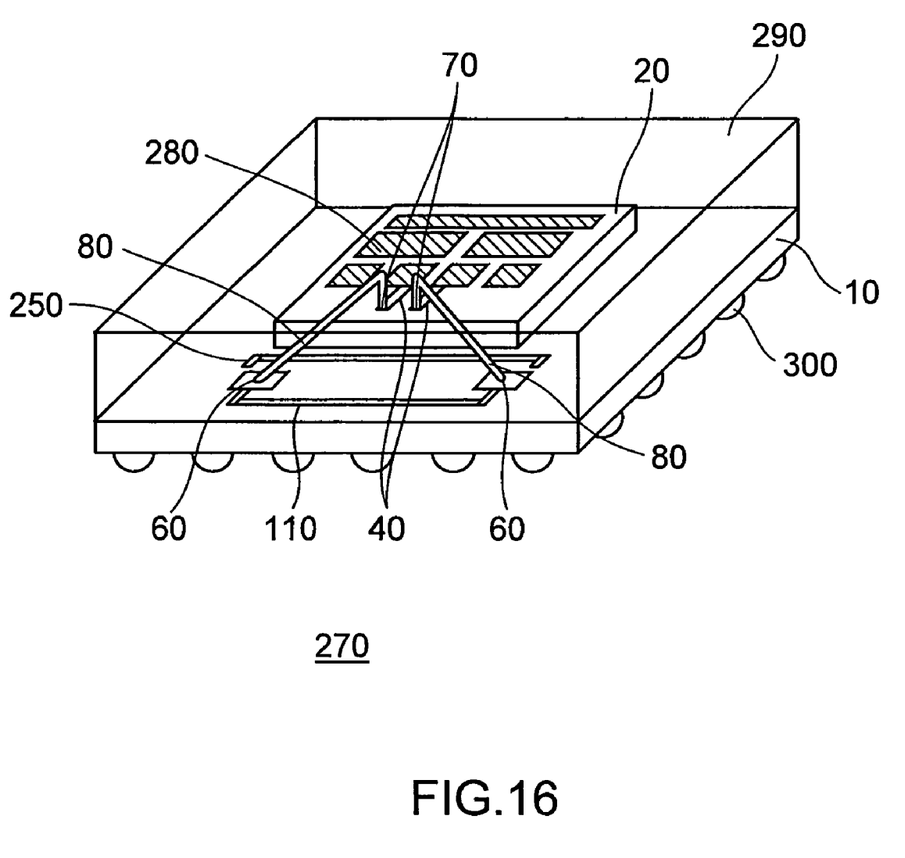
FIG. 16 is a diagram showing a general configuration of an antenna device according to a sixth embodiment of the present invention.

FIG. 16 is a diagram showing a general configuration of an antenna device 270 according to a sixth embodiment of the present invention. The antenna device 270 according to the sixth embodiment is modularized by disposing and connecting a differential circuit 280 to a tip of the differential feeders 40 of the antenna device 240 shown in FIG. 12, sealing the entire device by a sealant 290 and providing solder balls 300 underneath the dielectric substrate 10. Otherwise, since the configuration and operations of the antenna device 270 are the same as those of the antenna device 240 shown in FIG. 12, like reference numerals will be assigned and a description thereof will be omitted.

As depicted in the antenna device 270 according to the present embodiment, sealing the semiconductor chip 20, the wires 80, the metallic plate 60 and the like by the sealant 290 results in shorter electrical length. Consequently, the entire antenna element (in this case, corresponding to the wires 80 and the metallic plate 60) may be downsized, and since the module itself becomes the antenna device 270, an antenna need not be disposed at another location and reduction in space can be achieved.

(7) Seventh Embodiment

Next, with reference to FIG. 17 and FIG. 18, an application of an antenna device according to a seventh embodiment of the present invention will be described.

Figure 17:
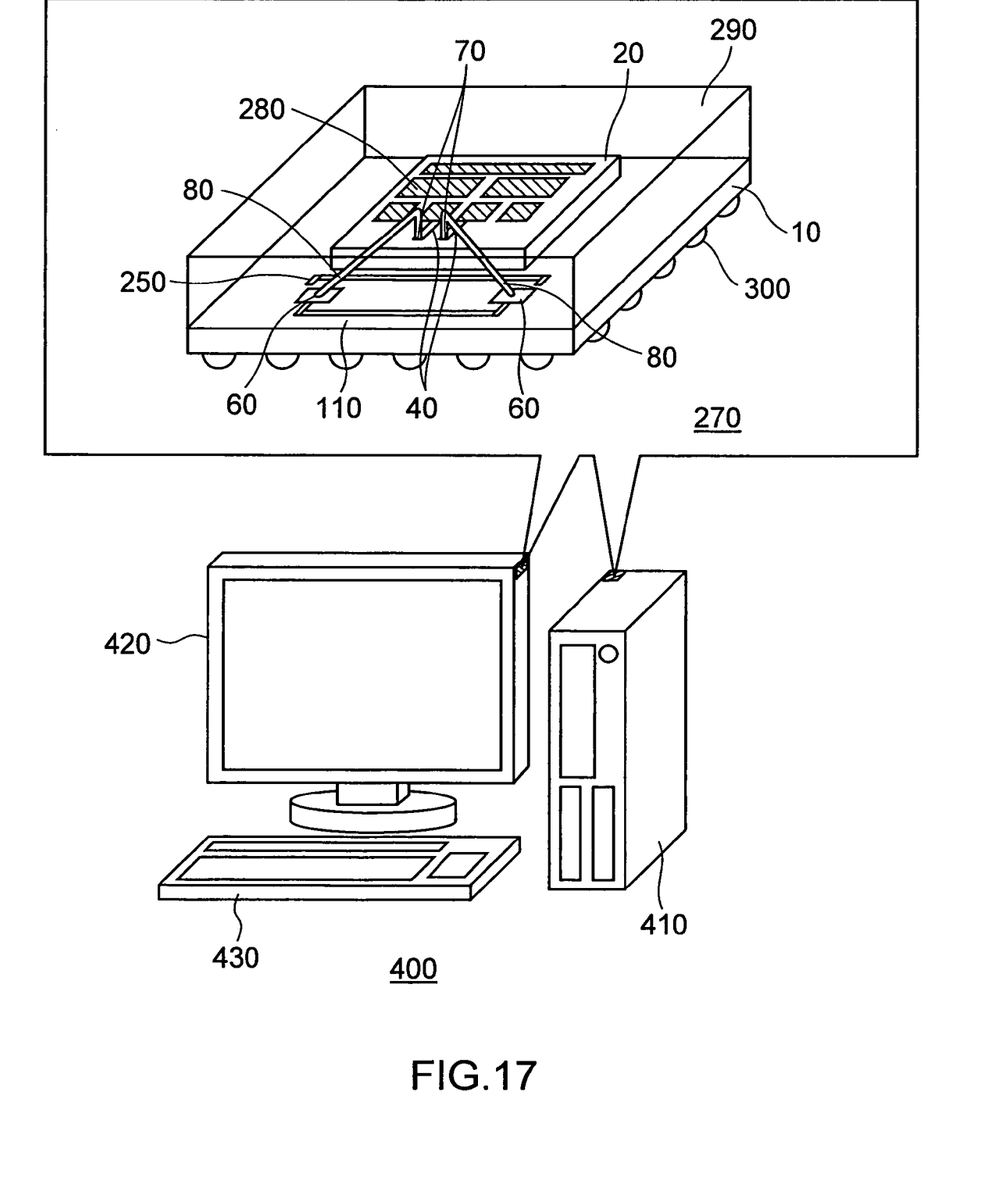
FIG. 17 is a diagram showing a general configuration of a data processing device according to a seventh embodiment of the present invention.

FIG. 17 is a diagram showing an antenna device 270 according to the present embodiment mounted on a data processing device 400. The data processing device 400 according to the present embodiment includes a main body 410 that processes data and the like, a display portion 420 that displays processing results of the main body 410 and the like, and an input portion 430 through which a user inputs information.

The main body 410 and the display unit 420 are respectively provided with the antenna device 270 shown in FIG. 16 either internally or externally, and communicate with each other using a millimeter waveband frequency. For example, the main body 410 transmits processed data via the antenna device 270 to the display portion 420, and the display portion 420 receives via the antenna device 270 data transmitted by the main body 410 and displays the data for the user.

In this case, while an example is described in which antenna devices 270 are mounted on the main body 410 and the display unit 420, the antenna device 270 can be mounted on the input portion 430, whereby the input portion 430 and the main body 410 communicate via the antenna device 270.

Next, an example in which the antenna device 270 according to the present embodiment is mounted on a mobile terminal 440 will be described with reference to FIG. 18.

Figure 18:
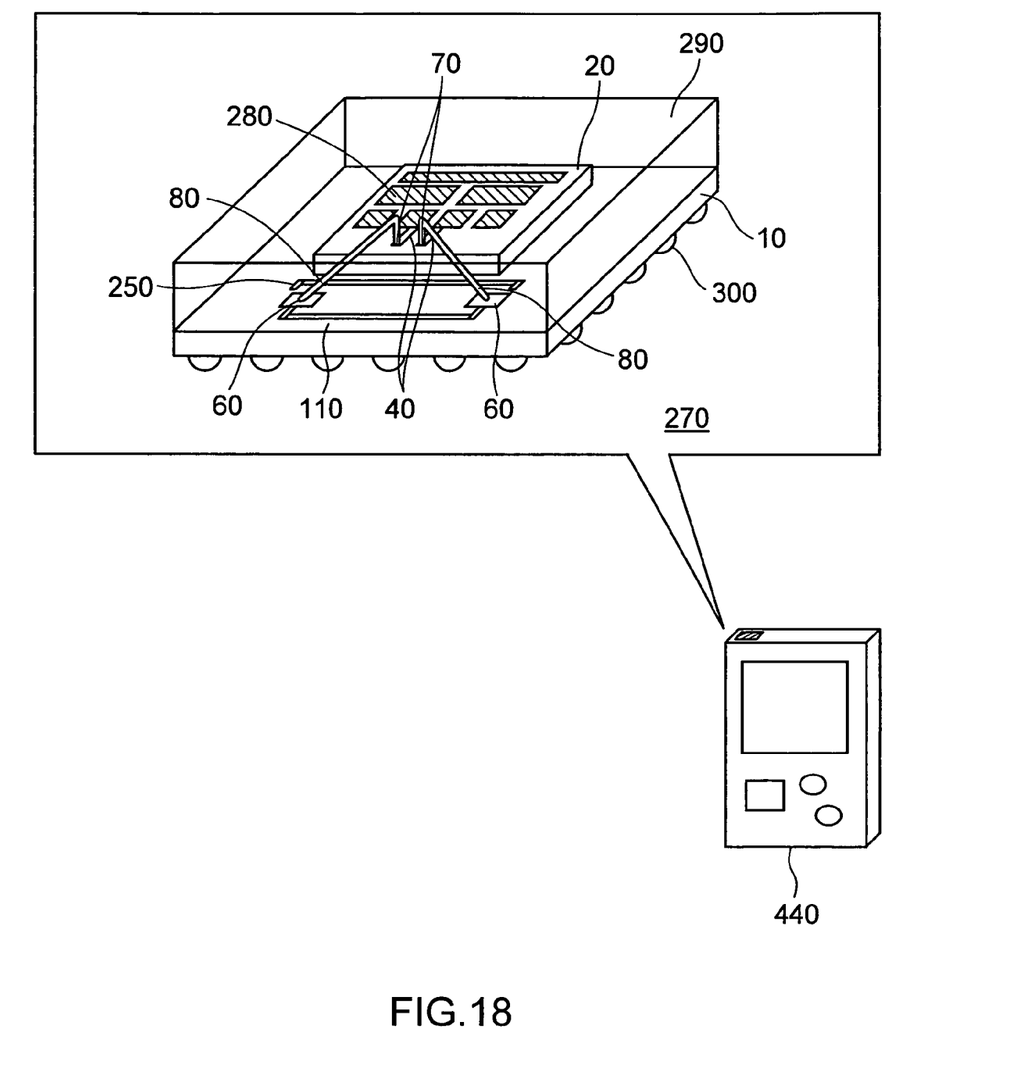
FIG. 18 is a diagram showing a general configuration of a mobile terminal according to the seventh embodiment of the present invention.

The mobile terminal 440 shown in FIG. 18 is for, for example, performing data processing for music playback. The mobile terminal 440 is internally or externally provided with the antenna device 270 shown in FIG. 16, and communicates using, for example, a millimeter waveband frequency.

The mobile terminal 440 shown in FIG. 18 performs data communication (music download or the like) via the antenna device 270 with, for example, the main body 410 of the data processing device 400 shown in FIG. 17. In addition, the mobile terminal 440 may perform data communication directly with the display portion 420 of the data processing device 400 to display images stored in the mobile terminal 440 on the display portion 420. Furthermore, the mobile terminal 440 may perform data communication directly with another mobile terminal (not shown) mounted with the antenna device 270 shown in FIG. 16 in order to exchange music or images.

As seen, according to the seventh embodiment, by mounting the modularized antenna device 270 on radio communication devices such as the data processing device 400 or the mobile terminal 440, transmission and reception of data, images and the like can be performed in a favorable manner. In addition, since the antenna device 270 is modularized, mounting on such devices can be performed easily. Furthermore, since the size of the antenna device 270 is almost the same as a semiconductor chip and is therefore extremely small, the antenna device 270 may even be disposed in a small space such as the lateral face of the display 420 or the lateral face of the mobile terminal 440, thereby increasing design freedom.

Moreover, for the present embodiment, while applications of the antenna device shown in FIG. 12 have been described, the same applications may be performed using the antenna devices shown in FIG. 1 and FIG. 3.

The present invention is not limited to the above-described embodiments as is, and at the implementation stage of the invention, the components thereof can be modified to materialize within a range that does not deviate from the gist of the present invention. Furthermore, various inventions can be embodied by appropriately combining a plurality of components disclosed in the above-described embodiments. For example, some of the components may be omitted from all of the components shown in the embodiments. Moreover, components across different embodiments may be appropriately combined.

What is claimed is:

1. An antenna device comprising:
a dielectric substrate;
a semiconductor chip disposed on the dielectric substrate;
a metallic plate having a band-like shape with a constant width that is wider than diameters of first and second wires, formed on the dielectric substrate so as to be approximately parallel to at least one side of the semiconductor chip;
first and second feeders formed on the semiconductor chip;
the first wire having first and second ends, the first end being connected with the first feeder and the second end being connected with the metallic plate; and
the second wire having third and fourth ends, the third end being connected with the second feeder and the fourth end being connected with the metallic plate, wherein
a distance L1 between the first end of the first wire and the third end of the second wire is smaller than a distance L2 between the second end of the first wire and the fourth end of the second wire (L1<L2).

2. The device according to claim 1, further comprising:
a parasitic metal element provided on the dielectric substrate and disposed on a side opposite to the side on which the semiconductor chip is formed with respect to the metallic plate.

3. The device according to claim 1, further comprising:
a parasitic metal element provided on the dielectric substrate and disposed between the metallic plate and the semiconductor chip.

4. The device according to claim 2, wherein
an open end of the parasitic metal element is bent in a direction in which the metallic plate is disposed.

5. The device according to claim 3, wherein
an open end of the parasitic metal element is bent in a direction in which the metallic plate is disposed.

6. The device according to claim 1, wherein
a length of a pathway from a connection of the first wire and the first feeder to a connection of the second wire and the second feeder and which includes the first and second wires and the metallic plate is approximately equivalent to one operating frequency wavelength.

7. The device according to claim 1, further comprising:
a differential circuit formed on the semiconductor chip and connected to differential feeders as the first and second feeder,
a sealant formed so as to cover the dielectric substrate and the semiconductor chip; and
solder balls formed under the dielectric substrate.

8. A radio communication device configured to perform data communication via the antenna device according to claim 1.

9. An antenna device comprising:
a dielectric substrate;
a semiconductor chip disposed on the dielectric substrate;
first and second metallic plates formed on the dielectric substrate;
first and second feeders formed on the semiconductor chip; and
a first wire configured to connect the first metallic plate and the first feeder, and a second wire configured to connect the second metallic plate and the second feeder, wherein
a distance L1 between connections of the first and second wires and the first and second feeders and a distance L2 between connections of the first and second wires and the first and second metallic plates have a relationship of L1<L2, and
the first and second metallic plates include:
first and second metal parts respectively formed so as to include respective connections with the first and second wires, and which are also respectively formed so that areas thereof are wider than cross-sectional areas of the first and second wires, and
a third metal part, having a width that is narrower than the first and second metal parts, and formed so as to extend from the first and second metal parts in approximately a vertical direction with respect to the semiconductor chip and which are also formed so as to electrically connect the first and second metal parts with each other.

10. The device according to claim 9, further comprising:
a parasitic metal element provided on the dielectric substrate and disposed on a side opposite to the side on which the semiconductor chip is formed with respect to the metallic plates.

11. The device according to claim 9, further comprising:
a parasitic metal element provided on the dielectric substrate and disposed between the metallic plates and the semiconductor chip.

12. The device according to claim 10, wherein
an open end of the parasitic metal element is bent in a direction in which the metallic plates are disposed.

13. The device according to claim 11, wherein
an open end of the parasitic metal element is bent in a direction in which the metallic plates are disposed.

14. The device according to claim 9, wherein
a length of a pathway from a connection of the first wire and the first feeder to a connection of the second wire and the second feeder and which includes the first and second wires and the metallic plates is approximately equivalent to one operating frequency wavelength.

15. The device according to claim 9, further comprising:
a differential circuit formed on the semiconductor chip and connected to differential feeders as the first and second feeder,
a sealant formed so as to cover the dielectric substrate and the semiconductor chip; and
solder balls formed under the dielectric substrate.

16. A radio communication device configured to perform data communication via the antenna device according to claim 9.

* * * * *